(12) United States Patent
Pagaila et al.

(10) Patent No.: US 8,288,201 B2
(45) Date of Patent: Oct. 16, 2012

(54) SEMICONDUCTOR DEVICE AND METHOD OF FORMING FO-WLCSP WITH DISCRETE SEMICONDUCTOR COMPONENTS MOUNTED UNDER AND OVER SEMICONDUCTOR DIE

(75) Inventors: Reza A. Pagaila, Singapore (SG); Yaojian Lin, Singapore (SG); Jun Mo Koo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 137 days.

(21) Appl. No.: 12/868,334

(22) Filed: Aug. 25, 2010

(65) Prior Publication Data
US 2012/0049344 A1 Mar. 1, 2012

(51) Int. Cl.
*H01L 21/44* (2006.01)
*H01L 21/50* (2006.01)

(52) U.S. Cl. ........ 438/107; 438/106; 438/109; 438/112; 438/124; 257/737; 257/777; 257/787; 257/687

(58) Field of Classification Search ............... 438/107, 438/106, 109, 112, 124; 257/737, 777, 782, 257/787, 687, 686, E21.499, E23.068
See application file for complete search history.

(56) References Cited

U.S. PATENT DOCUMENTS

| | | | |
|---|---|---|---|
| 5,841,193 A | 11/1998 | Eichelberger | |
| 6,781,222 B2 | 8/2004 | Wu et al. | |
| 6,995,448 B2 | 2/2006 | Lee et al. | |
| 7,005,325 B2 | 2/2006 | Chow et al. | |
| 7,023,085 B2 | 4/2006 | Pu | |
| 7,619,901 B2 | 11/2009 | Eichelberger et al. | |
| 8,143,097 B2 * | 3/2012 | Chi et al. | 438/107 |
| 2004/0067605 A1 | 4/2004 | Koizumi | |
| 2007/0152313 A1 * | 7/2007 | Periaman et al. | 257/686 |
| 2009/0170241 A1 | 7/2009 | Shim et al. | |

* cited by examiner

*Primary Examiner* — Theresa T Doan
(74) *Attorney, Agent, or Firm* — Robert D. Atkins; Patent Law Group: Atkins & Associates, P.C.

(57) ABSTRACT

A semiconductor die has first and second discrete semiconductor components mounted over a plurality of wettable contact pads formed on a carrier. Conductive pillars are formed over the wettable contact pads. A semiconductor die is mounted to the conductive pillars over the first discrete components. The conductive pillars provide vertical stand-off of the semiconductor die as headroom for the first discrete components. The second discrete components are disposed outside a footprint of the semiconductor die. Conductive TSV can be formed through the semiconductor die. An encapsulant is deposited over the semiconductor die and first and second discrete components. The wettable contact pads reduce die and discrete component shifting during encapsulation. A portion of a back surface of the semiconductor die is removed to reduce package thickness. An interconnect structure is formed over the encapsulant and semiconductor die. Third discrete semiconductor components can be mounted over the semiconductor die.

25 Claims, 14 Drawing Sheets

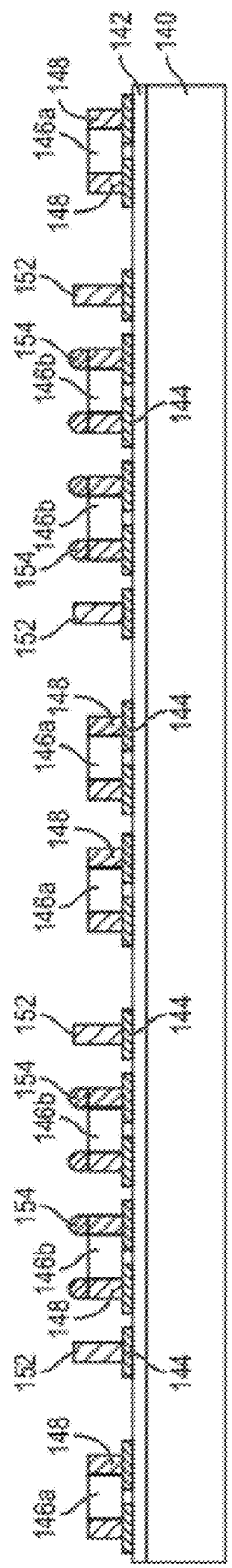
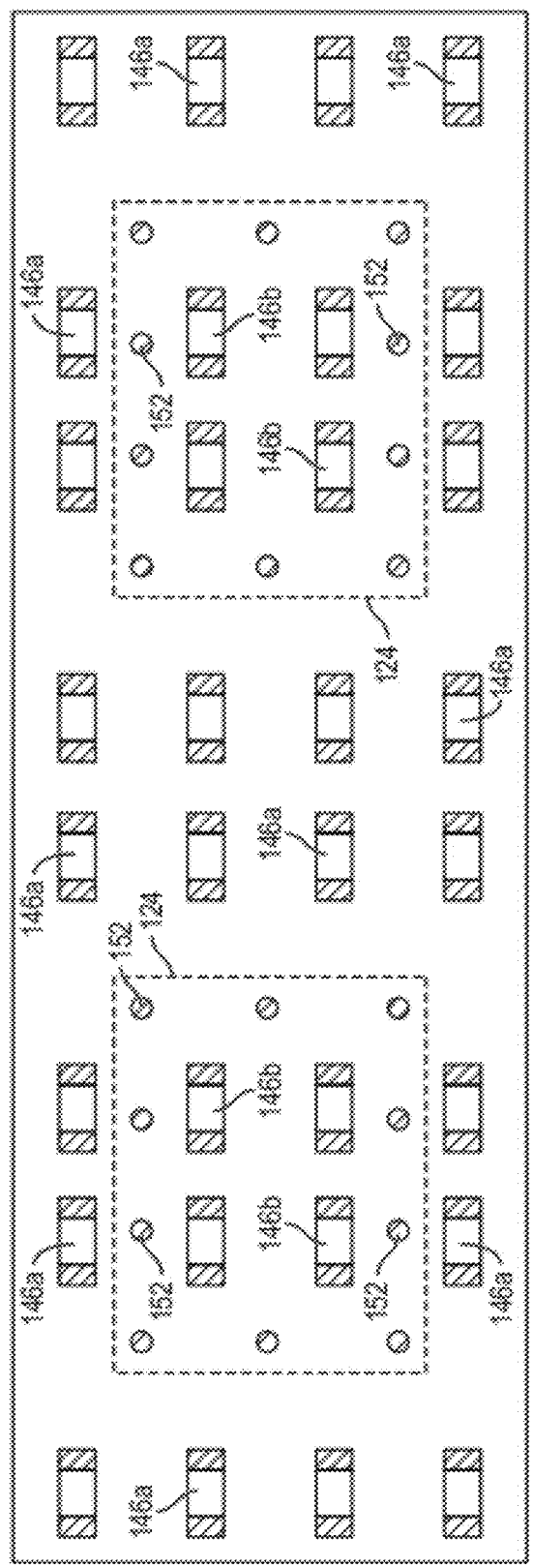

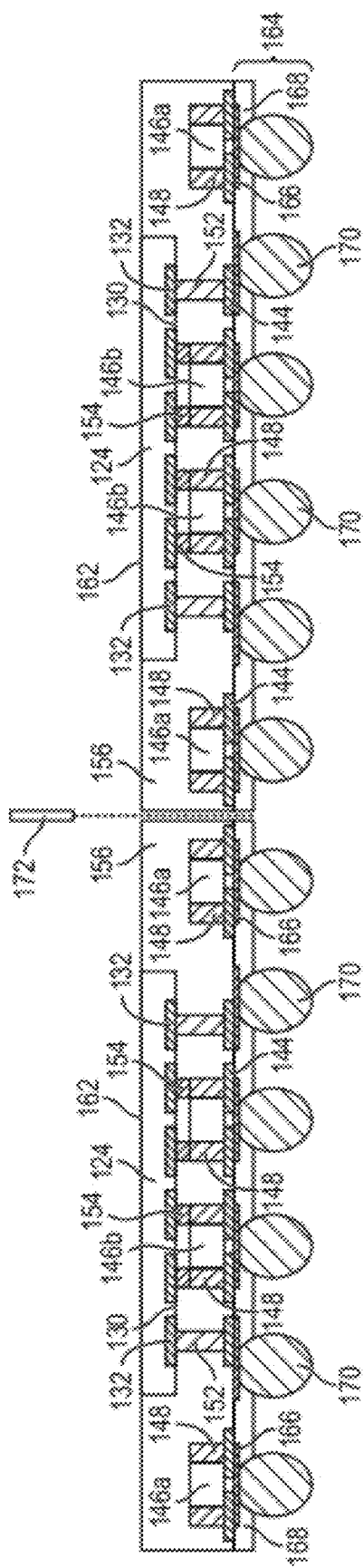
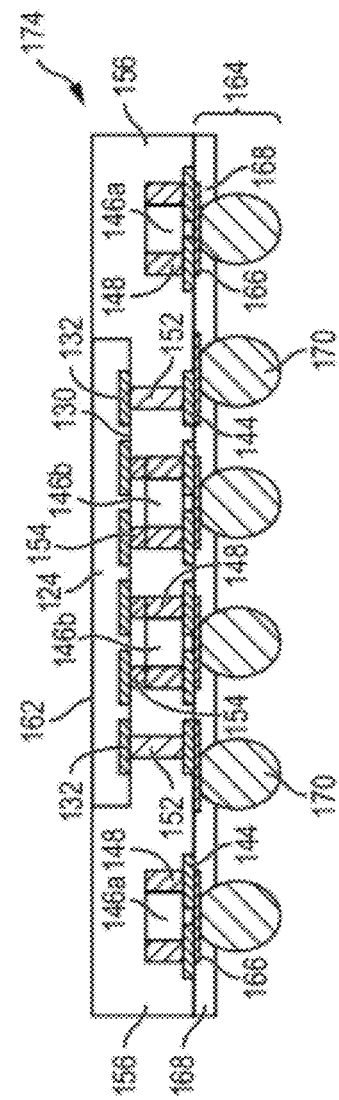
FIG. 4I
FIG. 5

SEMICONDUCTOR DEVICE AND METHOD OF FORMING FO-WLCSP WITH DISCRETE SEMICONDUCTOR COMPONENTS MOUNTED UNDER AND OVER SEMICONDUCTOR DIE

FIELD OF THE INVENTION

The present invention relates in general to semiconductor devices and, more particularly, to a semiconductor device and method of forming a Fo-WLCSP with discrete semiconductor components mounted under and over a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In conventional fan-out wafer level chip scale packages (Fo-WLCSP), a semiconductor die is typically enclosed by an encapsulant. A build-up interconnect structure is formed over the encapsulant and semiconductor die. Discrete semiconductor components can be placed around a perimeter of the semiconductor die for additional electrical function. However, the peripheral discrete semiconductor components increase the size or footprint of the Fo-WLCSP. The larger Fo-WLCSP footprint needed for the peripheral discrete semiconductor components increases the size and cost of the build-up interconnect structure. In addition, the discrete semiconductor components are typically mounted with double-sided tape. The adhesion property of double-sided tape makes the discrete semiconductor components susceptible to shifting during encapsulation.

In an effort to reduce lateral space requirements, U.S. Pat. No. 6,995,448 discloses discrete semiconductor components mounted under a wire-bonded semiconductor die. Yet, placing the discrete semiconductor components under the semiconductor die increases the package height, which is not suitable for many applications.

SUMMARY OF THE INVENTION

A need exists to mount discrete semiconductor components within Fo-WLCSP in a space-saving and efficient manner to provide both a small footprint and thin package. Accordingly, in one embodiment, the present invention is a method of making a semiconductor device comprising the steps of providing a carrier, forming a plurality of wettable contact pads over the carrier, mounting a plurality of first discrete semiconductor components over the wettable contact pads, mounting a plurality of second discrete semiconductor components over the wettable contact pads, forming a plurality of conductive pillars over the wettable contact pads, mounting a semiconductor die to the conductive pillars over the first discrete semiconductor components with the second discrete semiconductor components disposed outside a footprint of the semiconductor die, depositing an encapsulant over the semiconductor die and first and second discrete semiconductor components, removing a portion of a back surface of the semiconductor die opposite the conductive pillars, removing the carrier, and forming a first interconnect structure over the encapsulant and semiconductor die.

In another embodiment, the present invention is a method of making a semiconductor device comprising the steps of providing a carrier, mounting a first discrete semiconductor component over the carrier, forming a first interconnect structure over the carrier, mounting a semiconductor die to the first interconnect structure over the first discrete semiconductor component, depositing an encapsulant over the semiconductor die and first discrete semiconductor component, removing a portion of a back surface of the semiconductor die opposite the first interconnect structure, removing the carrier, and forming a second interconnect structure over the encapsulant and semiconductor die.

In another embodiment, the present invention is a method of making a semiconductor device comprising the steps of providing a carrier, mounting a first discrete semiconductor component over the carrier, mounting a semiconductor die to the carrier with the first discrete semiconductor component disposed outside a footprint of the semiconductor die, removing a portion of a back surface of the semiconductor die, mounting a second discrete semiconductor component over the semiconductor die, depositing an encapsulant over the semiconductor die and first and second discrete semiconductor components, removing the carrier, and forming an interconnect structure over the encapsulant and semiconductor die.

In another embodiment, the present invention is a semiconductor device comprising a first discrete semiconductor component and first interconnect structure formed adjacent to the first discrete semiconductor component. A semiconductor die is mounted to the first interconnect structure over the first discrete semiconductor component. A portion of a back surface of the semiconductor die is removed. An encapsulant is deposited over the semiconductor die and first discrete semiconductor component. A second interconnect structure is formed over the encapsulant and semiconductor die.

BRIEF DESCRIPTION OF THE DRAWINGS

FIGS. 4a-4l illustrate a process of forming a Fo-WLCSP with discrete semiconductor components mounted under a semiconductor die;

FIG. 5 illustrates the Fo-WLCSP with discrete semiconductor components mounted under the semiconductor die;

DETAILED DESCRIPTION OF THE DRAWINGS

Figure 1:
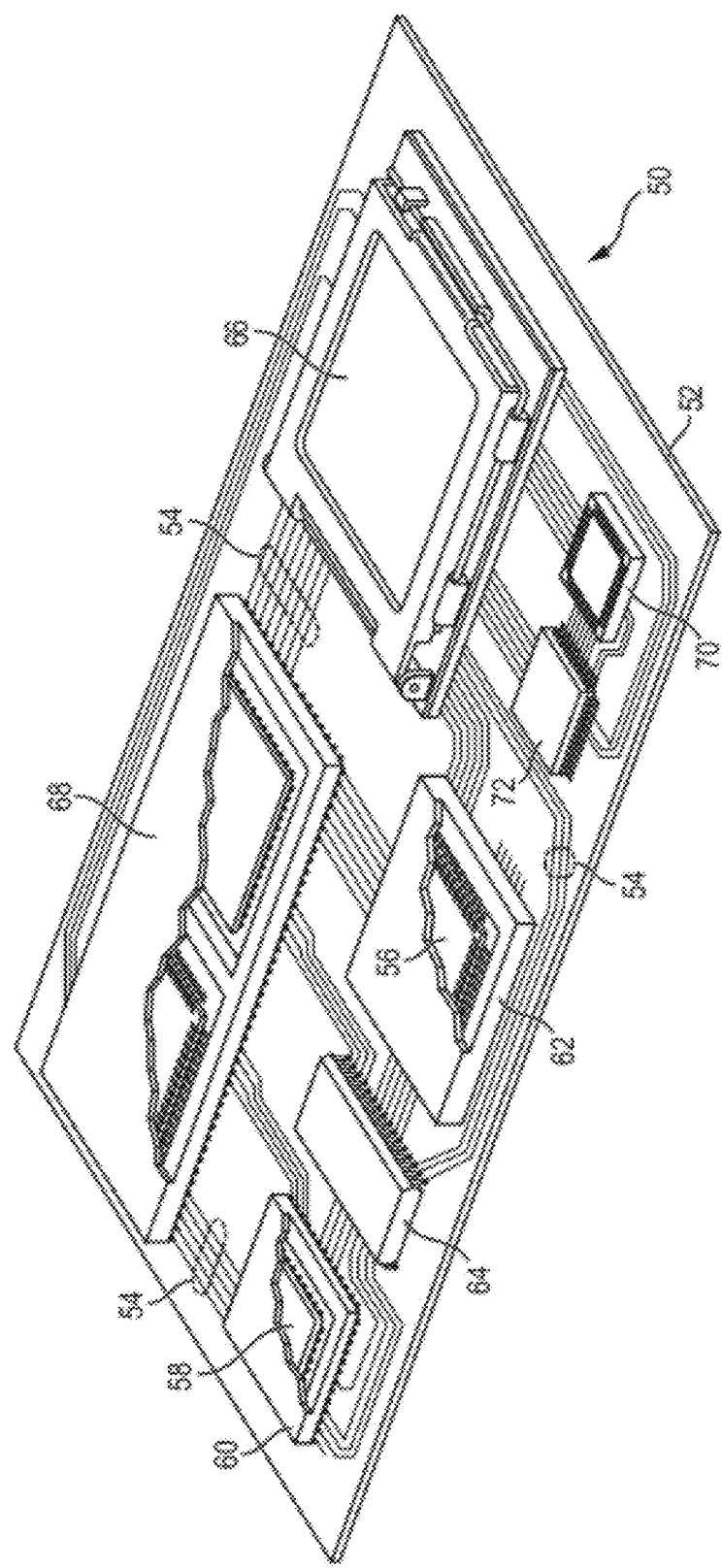
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes.

The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
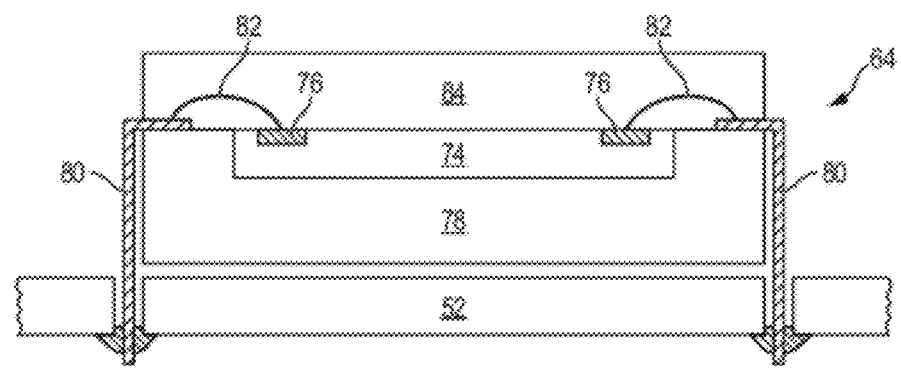
FIGS. 2a-2c illustrate further detail of the representative semiconductor packages mounted to the PCB.
Figure 2B:
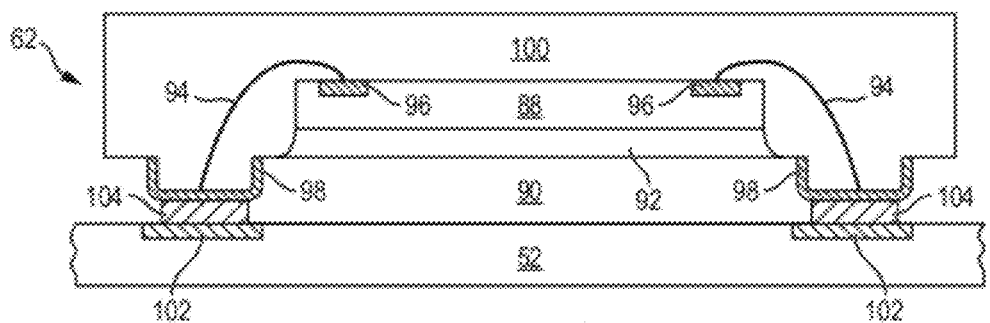
Figure 2C:
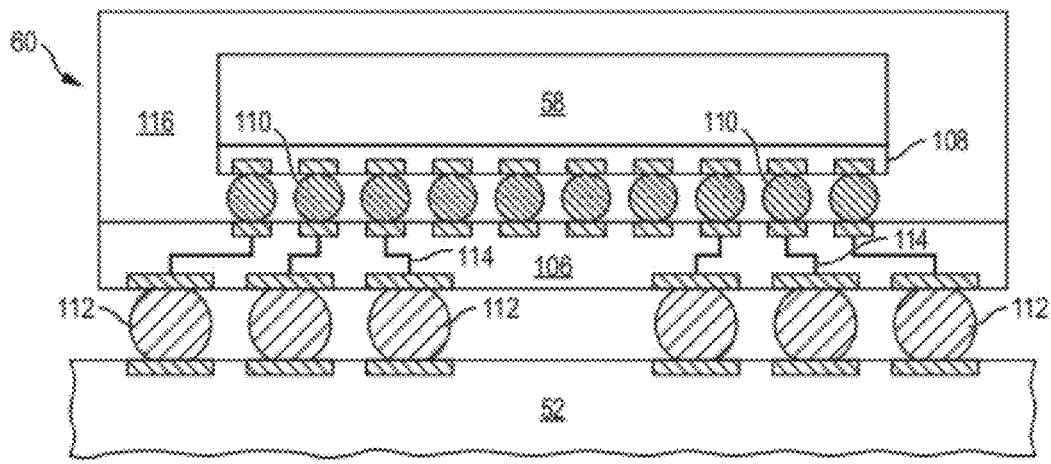

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
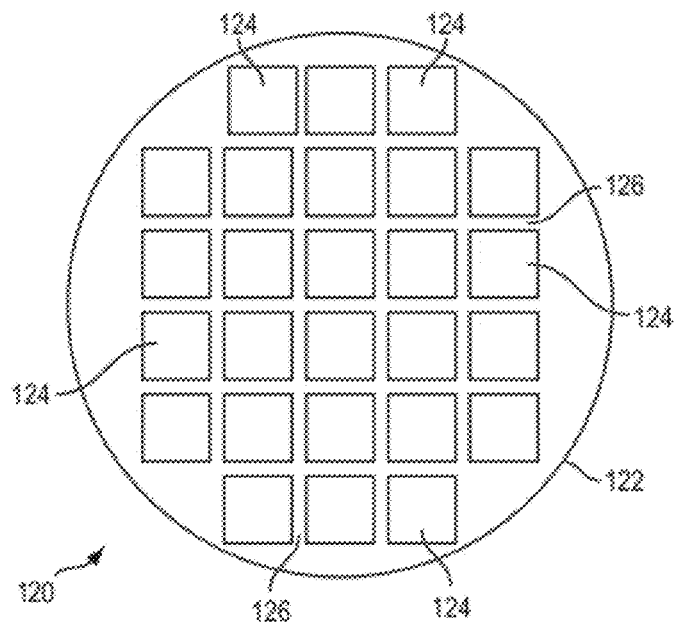
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
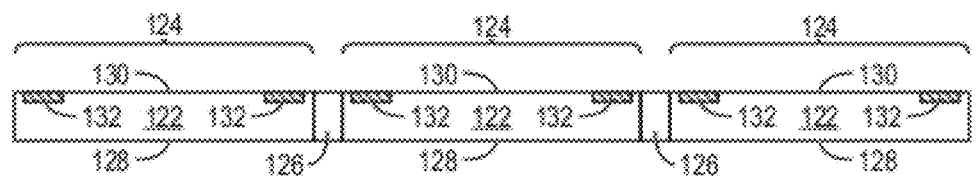

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPD), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 3C:
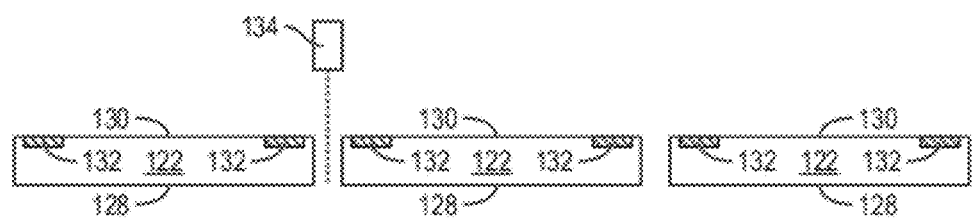

In FIG. 3c, semiconductor wafer 120 is singulated through saw street 126 using a saw blade or laser cutting tool 134 into individual semiconductor die 124.

Figure 4A:
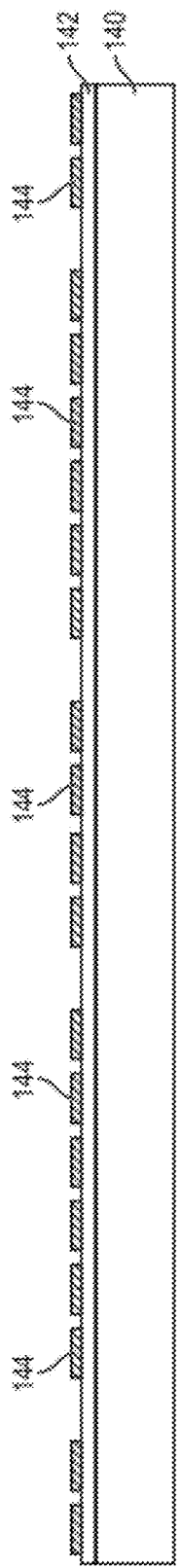

FIGS. 4a-4l illustrate, in relation to FIGS. 1 and 2a-2c, a process of forming a Fo-WLCSP with discrete semiconductor components mounted under a semiconductor die. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

An electrically conductive layer 144 is formed over interface layer 142 of carrier 140 using PVD, CVD, electrolytic plating, electroless plating process, or other suitable metal deposition process. Conductive layer 144 can be one or more layers of Al, Cu, Sn, Ni, Au, Ag, or other suitable electrically conductive material. Conductive layer 144 operates as wettable contact pads containing flux material.

Figure 4B:
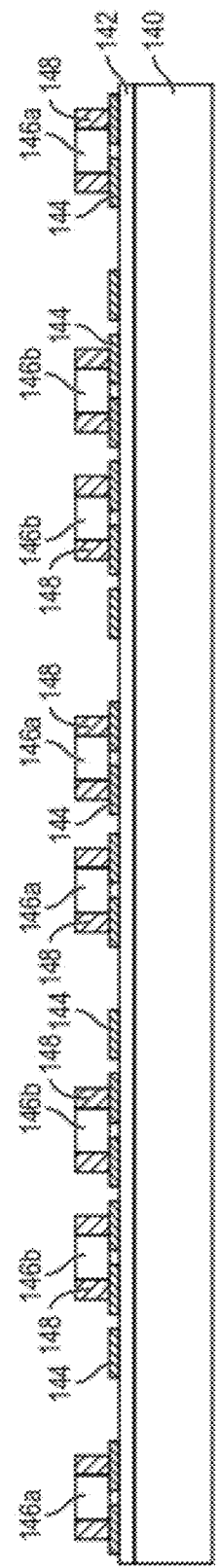

In FIG. 4b, a plurality of discrete semiconductor components 146 is mounted to wettable contact pads 144 using a pick and place operation. A solder paste can be deposited on leads 148 of discrete semiconductor components 146. A reflow operation is used to metallurgically and electrically connect discrete semiconductor components 146 to wettable contact pads 144. Examples of discrete semiconductor components 146 include individual transistors, diodes, resistors, capacitors, and inductors, as well as other active and passive discrete components.

Figure 4C:
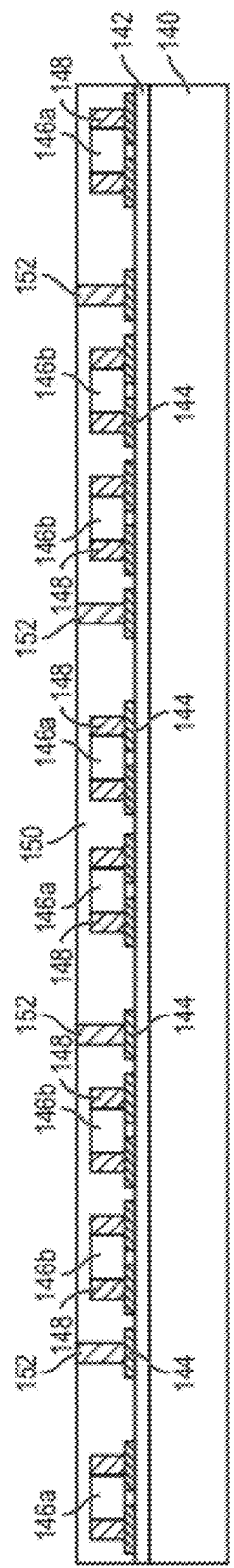

In FIG. 4c, a photoresist layer 150 is formed over interface layer 142 and discrete semiconductor components 146. A portion of photoresist layer 150 is removed over certain wettable contact pads 144 by an etching process to form vias down to wettable contact pads 144. In particular, the vias are formed over those wettable contact pads 144 positioned around discrete semiconductor components 146b and designated for electrical connection to a subsequently mounted semiconductor die. The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process.

In FIG. 4d, photoresist layer 150 is removed leaving z-direction vertical interconnect conductive pillars 152 over wettable contact pads 144. A shorter conductive pillar 154 can be formed over leads 148 of discrete semiconductor components 146b. The different length conductive pillars 152 and 154 can be formed by dual-time plating using dual-time masking. Alternatively, a single plating process is used to form conductive pillars 152, and stud bumps or micro-bumps 154 are formed over leads 148 of discrete semiconductor components 146b. FIG. 4e shows a top view of discrete semiconductor components 146a disposed outside the footprint or area designated for semiconductor die 124, discrete semiconductor components 146b disposed inside the footprint or area designated for semiconductor die 124, and conductive pillars 152 formed around discrete semiconductor components 146b.

Figure 4F:
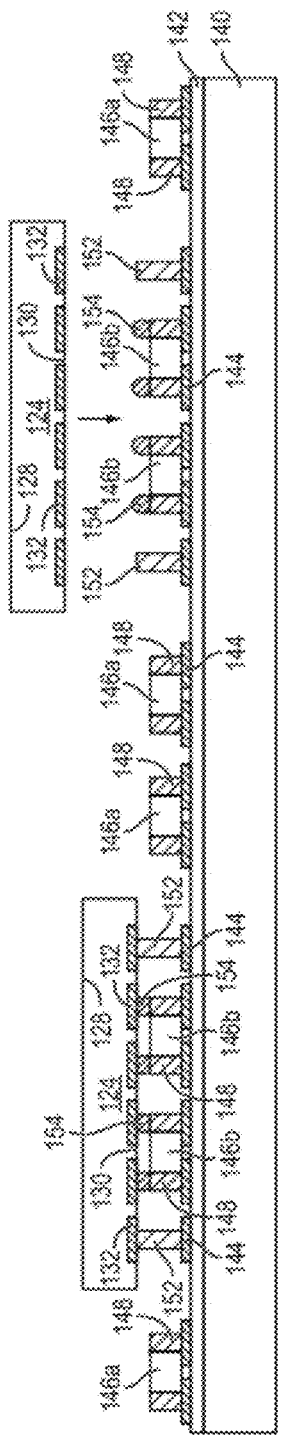
Figure 4G:
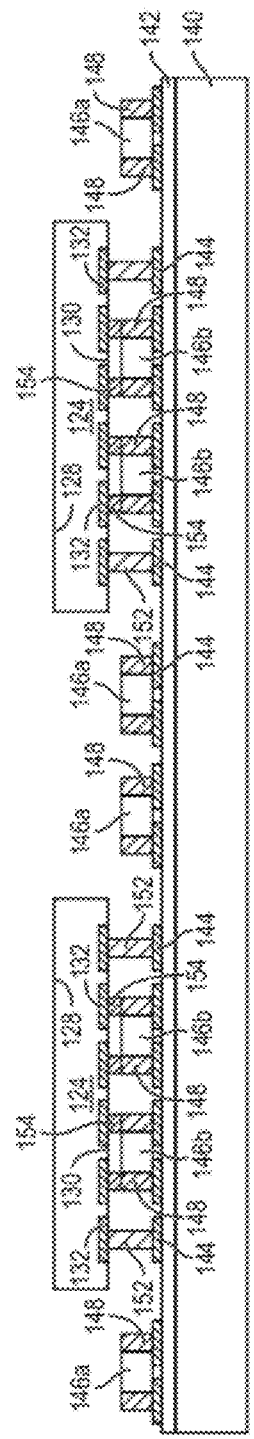

In FIG. 4f, semiconductor die 124 from FIGS. 3a-3c are mounted over conductive pillars 152 with active surface 130 oriented toward carrier 140 using a pick and place operation. FIG. 4g shows contact pads 132 of semiconductor die 124 metallurgically and electrically connected to conductive pillars 152 and micro-bumps 154. Discrete semiconductor components 146a are disposed outside a footprint of semiconductor die 124, e.g., around a perimeter of the semiconductor die. Conductive pillars 152 provide sufficient vertical stand-off or headroom for semiconductor die 124 with respect to carrier 140 to dispose discrete semiconductor components 146b under the semiconductor die.

Figure 4H:
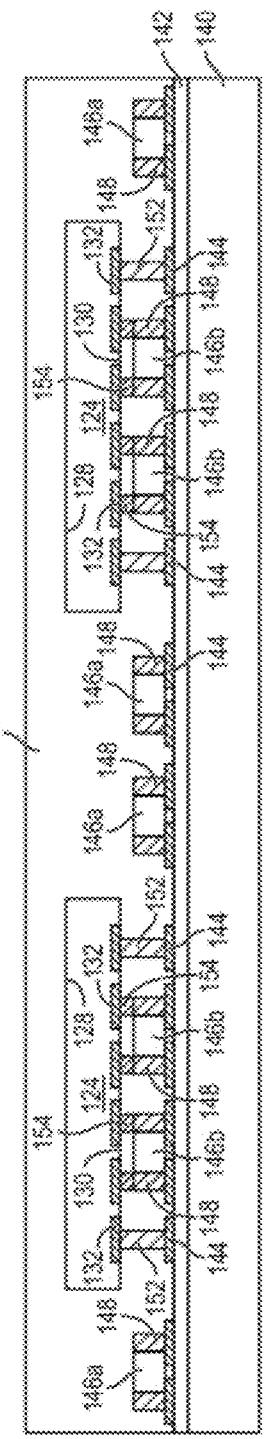

In FIG. 4h, an encapsulant or molding compound 156 is deposited over carrier 140, semiconductor die 124, and discrete semiconductor components 146 using a paste printing, compressive molding, transfer molding, liquid encapsulant molding, vacuum lamination, spin coating, or other suitable applicator. Encapsulant 156 can be polymer composite material, such as epoxy resin with filler, epoxy acrylate with filler, or polymer with proper filler. Encapsulant 156 is non-conductive and environmentally protects the semiconductor device from external elements and contaminants. Wettable contact pads 144 hold semiconductor die 124 and discrete semiconductor components 146 securely in place to reduce die and component shifting during encapsulation and subsequent die thinning operations.

Figure 4I:
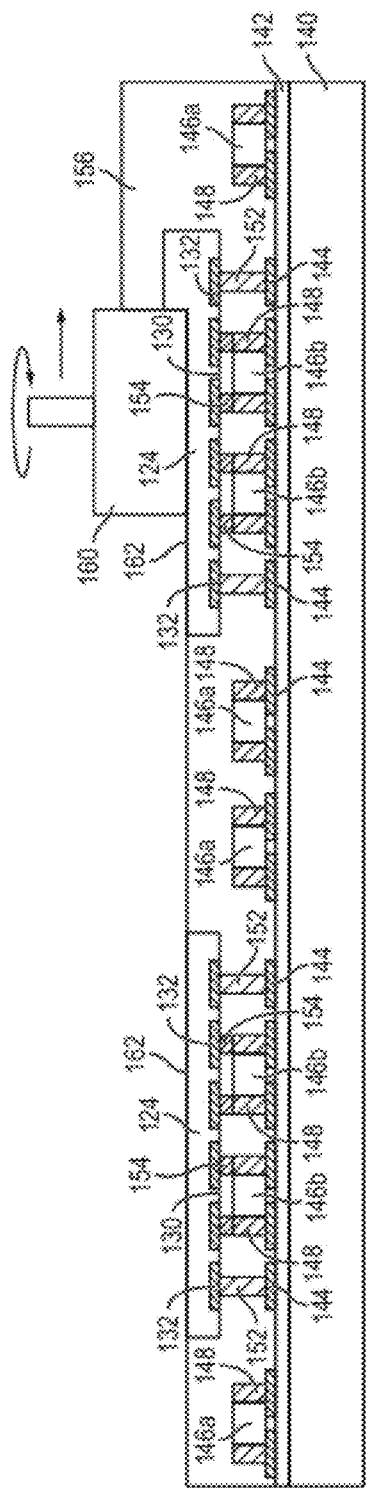

FIG. 4i shows a backgrinding operation where grinder 160 removes a portion of encapsulant 156 and bulk material 122 from back surface 128 of semiconductor die 124. Semiconductor die 124 is thinner and new back surface 162 is coplanar with encapsulant 156 following the grinding operation.

Figure 4J:
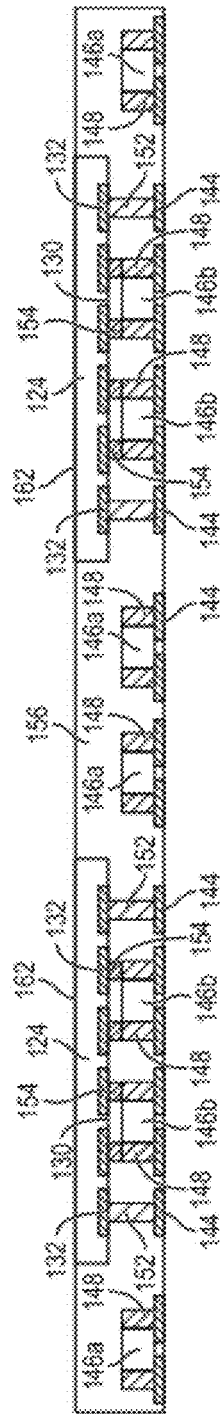

In FIG. 4j, carrier 140 and interface layer 142 are removed by chemical etching, mechanical peeling, CMP, mechanical grinding, thermal bake, UV light, laser scanning, or wet stripping to expose semiconductor die 124, conductive pillars 152, and encapsulant 156.

Figure 4K:
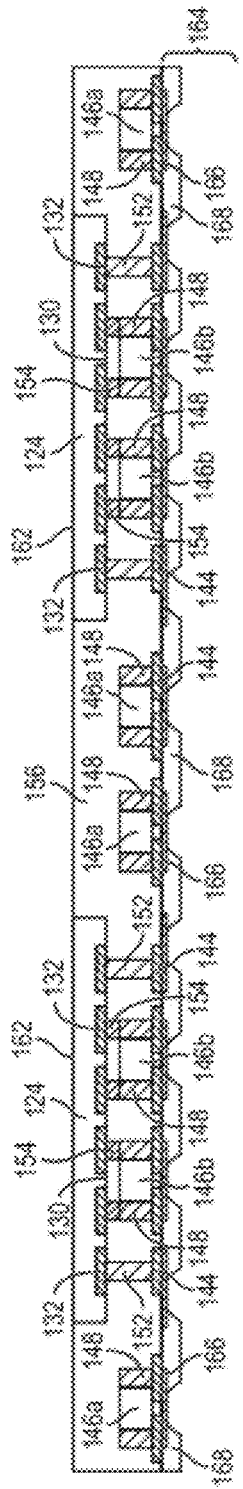

In FIG. 4k, a build-up interconnect structure 164 is formed over semiconductor die 124, conductive pillars 152, and encapsulant 156. The build-up interconnect structure 164 includes an electrically conductive layer or redistribution layer (RDL) 166 formed using a patterning and metal deposition process such as sputtering, electrolytic plating, and electroless plating. Conductive layer 166 can be one or more layers of Al, Cu, Sn, Ni, Au, Ag, or other suitable electrically conductive material. One portion of conductive layer 166 is electrically connected to conductive pillars 152. Other portions of conductive layer 166 can be electrically common or electrically isolated depending on the design and function of semiconductor die 124.

An insulating or passivation layer 168 is formed around conductive layer 166 for electrical isolation using PVD, CVD, printing, spin coating, spray coating, sintering or thermal oxidation. The insulating layer 168 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 168 can be removed by an etching process to expose conductive layer 166 for additional electrical interconnect.

In FIG. 4l, an electrically conductive bump material is deposited over build-up interconnect structure 164 and electrically connected to the exposed portion of conductive layer 166 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 166 using a suitable attachment or bonding process. In one embodiment, the bump material is reflowed by heating the material above its melting point to form spherical balls or bumps 170. In some applications, bumps 170 are reflowed a second time to improve electrical contact to conductive layer 166. An under bump metallization (UBM) can be formed under bumps 170. The bumps can also be compression bonded to conductive layer 166. Bumps 170 represent one type of interconnect structure that can be formed over conductive layer 166. The interconnect structure can also use stud bump, micro bump, or other electrical interconnect.

Semiconductor die 124 are singulated through encapsulant 156 and build-up interconnect structure 164 with saw blade or laser cutting tool 172 into individual Fo-WLCSP 174. FIG. 5 shows Fo-WLCSP 174 after singulation. Semiconductor die 124 is electrically connected through contact pads 132 and conductive pillars 152 to conductive layer 144 and build-up interconnect structure 164. Discrete semiconductor components 146a are electrically connected to conductive layer 144 and build-up interconnect structure 164. Discrete semiconductor components 146b are electrically connected to contact pads 132 of semiconductor die 124, conductive layer 144, and build-up interconnect structure 164. Fo-WLCSP 174 has a space-saving, efficient layout with discrete semiconductor components 146b disposed under semiconductor die. The size and material cost of Fo-WLCSP 174 is reduced. Conductive pillars 152 provide stand-off for placement of discrete semiconductor components 146b under semiconductor die 124, as well as a fine pitch interconnect. The close proximity of discrete semiconductor components 146b to active surface 130 reduces lead length and improves electrical performance. Although conductive pillars 152 and discrete semiconductor components 146b tend to increase the thickness of Fo-WLCSP 174, backgrinding semiconductor die 124 mitigates the impact to the overall height of the Fo-WLCSP.

Figure 6:
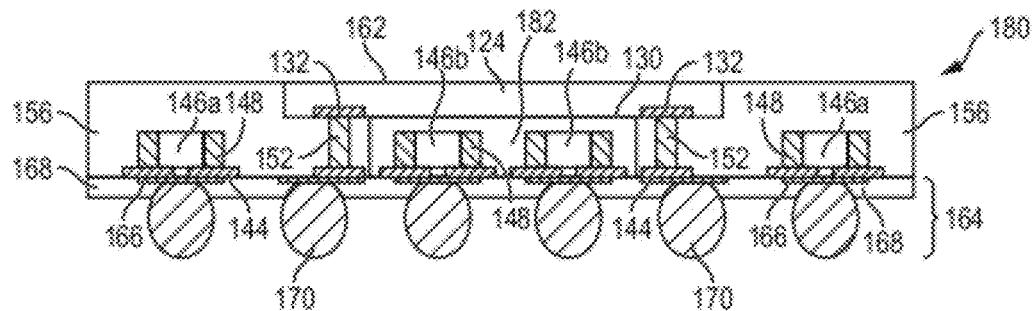
FIG. 6 illustrates the Fo-WLCSP with an insulating layer formed between the discrete semiconductor components and semiconductor die.

FIG. 6 shows an embodiment of Fo-WLCSP 180, similar to FIG. 5, with an insulating material 182 formed around discrete semiconductor components 146b prior to mounting semiconductor die 124 in FIG. 4f. The insulating layer 182 is formed using PVD, CVD, printing, spin coating, spray coating, sintering or thermal oxidation. The insulating layer 182 contains one or more layers of SiO2, Si3N4, SiON, Ta2O5, Al2O3, or other material having similar insulating and structural properties. In this case, discrete semiconductor components 146b are electrically connected to semiconductor die 124 through conductive layer 144, conductive pillars 152, and build-up interconnect structure 164.

Figure 7:
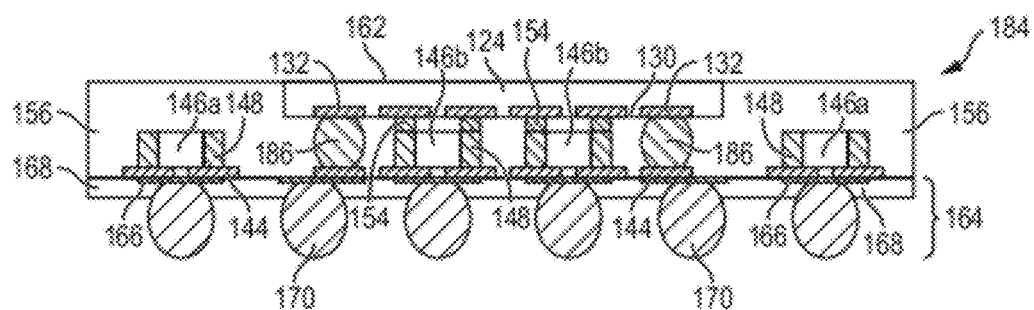
FIG. 7 illustrates the Fo-WLCSP with the semiconductor die mounted to the build-up interconnect structure using bumps.

FIG. 7 shows an embodiment of Fo-WLCSP 184, similar to FIG. 5, with bumps 186 formed between conductive layer 144 and contact pads 132 of semiconductor die 124. Bumps 186 can be formed on contacts pads 132 while in wafer form, see FIGS. 3a-3c. The bumped semiconductor die 124 are mounted to wettable contact pads 144 with discrete semiconductor components 146b disposed under the semiconductor die. Discrete semiconductor components 146b are electrically connected to contact pads 132 of semiconductor die 124 with stud bumps or micro-bumps 154.

Figure 8:
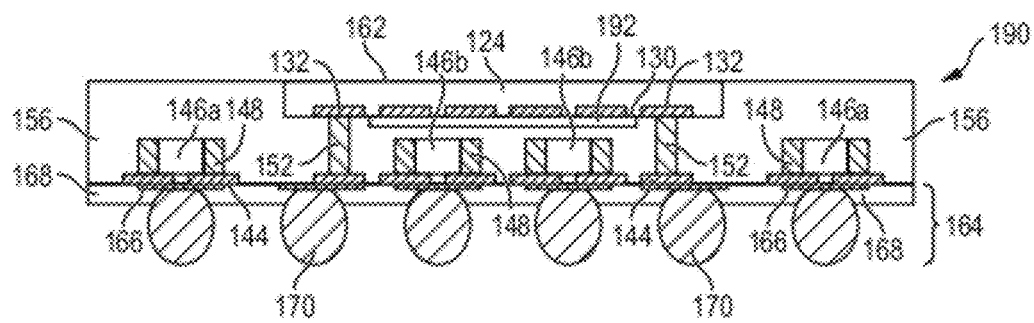
FIG. 8 illustrates the Fo-WLCSP with a shielding layer formed between the discrete semiconductor components and semiconductor die.

FIG. 8 shows an embodiment of Fo-WLCSP 190, similar to FIG. 5, with an EMI and RFI shielding layer 192 formed between discrete semiconductor components 146b and active surface 130 of semiconductor die 124. Shielding layer 192 can be Al, ferrite or carbonyl iron, stainless steel, nickel silver, low-carbon steel, silicon-iron steel, foil, conductive resin, and other metals and composites capable of blocking or absorbing EMI, RFI, and other inter-device interference. Shielding layer 192 can also be a non-metal material such as carbon-black or aluminum flake to reduce the effects of EMI and RFI. For non-metal materials, shielding layer 192 can be applied by lamination, spraying, or painting.

Figure 9A:
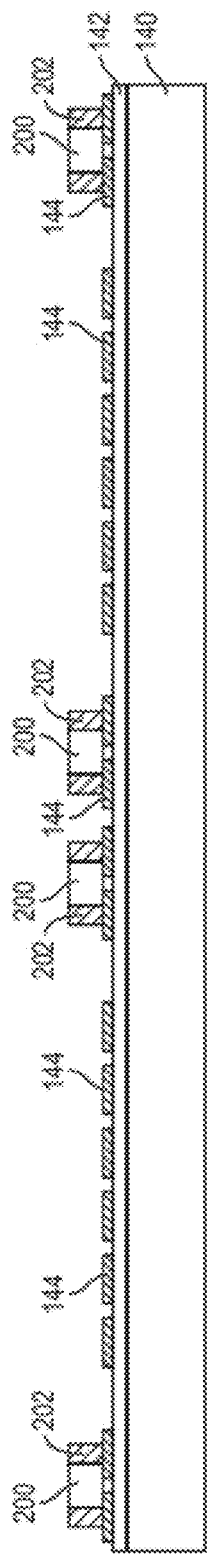
FIGS. 9a-9i illustrate a process of forming a Fo-WLCSP with discrete semiconductor components mounted over a semiconductor die.

FIGS. 9a-9i illustrate, in relation to FIGS. 1 and 2a-2c, a process of forming a Fo-WLCSP with discrete semiconductor components mounted over a semiconductor die. Continuing from FIG. 4a, a plurality of discrete semiconductor components 200 is mounted to wettable contact pads 144 using a pick and place operation, as shown in FIG. 9a. A solder paste can be deposited on leads 202 of discrete semiconductor components 202. A reflow operation is used to metallurgically and electrically connect discrete semiconductor components 200 to wettable contact pads 144. Examples of discrete semiconductor components 200 include individual transistors, diodes, resistors, capacitors, and inductors, as well as other active and passive discrete components.

Figure 9B:
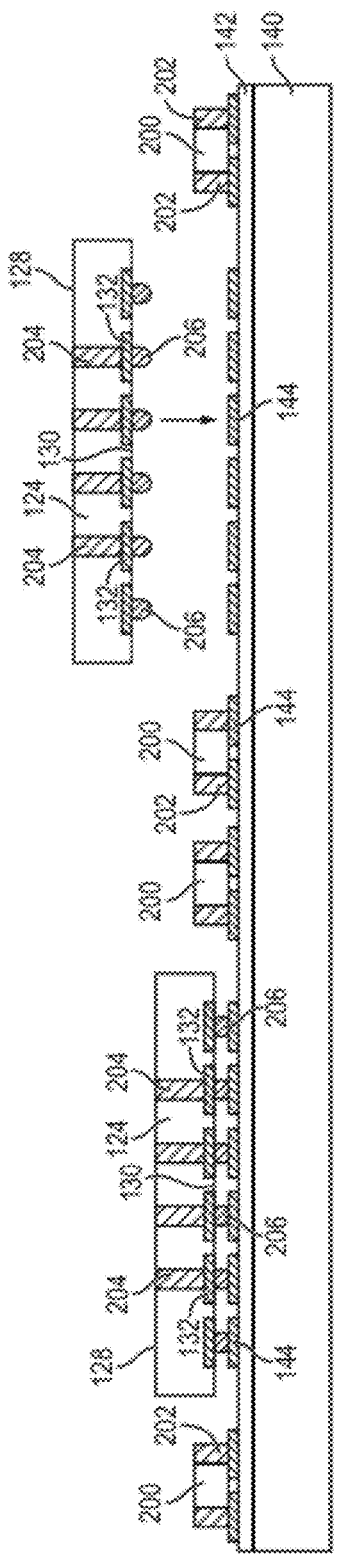

In FIG. 9b, semiconductor die 124 from FIGS. 3a-3c are mounted over wettable contact pads 144 with active surface 130 oriented toward carrier 140 using a pick and place operation. In this case, semiconductor die 124 includes conductive through silicon vias (TSV) 204 and bumps 206 formed on contact pads 132. Conductive vias 204 are formed by drilling or cutting vias through base semiconductor material 122 between contact pads 132 and back surface 128. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive TSV 204.

Figure 9C:
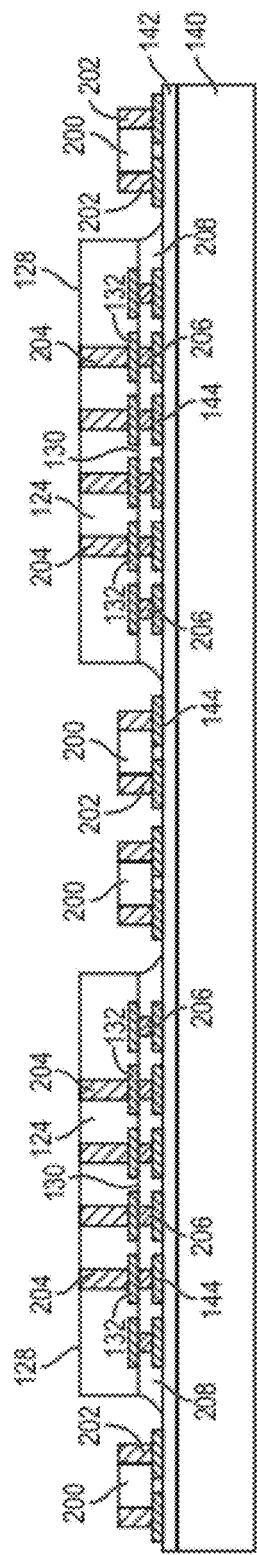

FIG. 9c shows contact pads 132 of semiconductor die 124 metallurgically and electrically connected to wettable contact pads 144 using bumps 206. An optional underfill material 208, such as epoxy resin, is deposited under semiconductor die 124 around bumps 206. Discrete semiconductor components 200 are disposed outside a footprint of semiconductor die 124, e.g., around a perimeter of the semiconductor die.

Figure 9D:
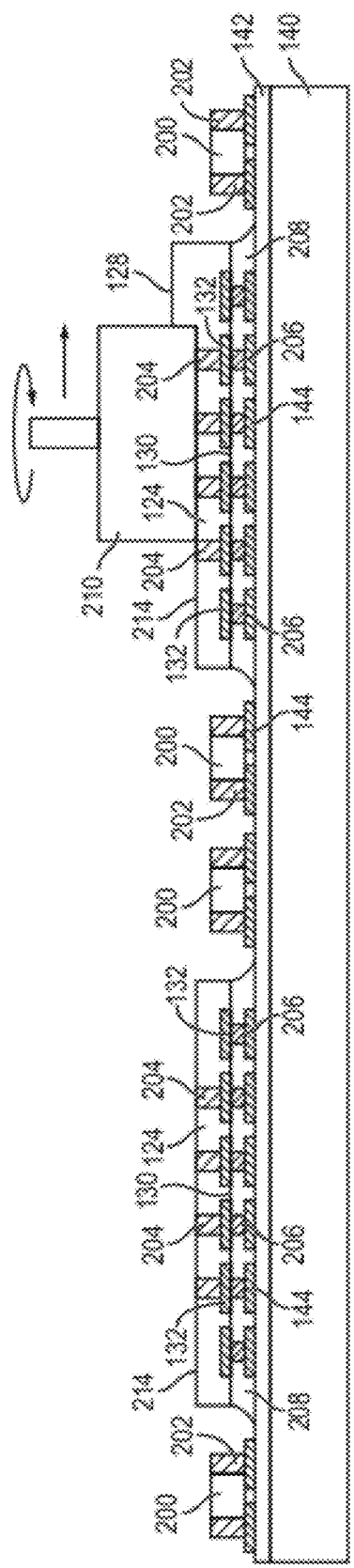

FIG. 9d shows a backgrinding operation where grinder 210 removes a portion of bulk material 122 from back surface 128 of semiconductor die 124. Underfill material 208 provides structural support for semiconductor die 124 during the grinding operation to reduce the thickness of the semiconductor die.

Figure 9E:
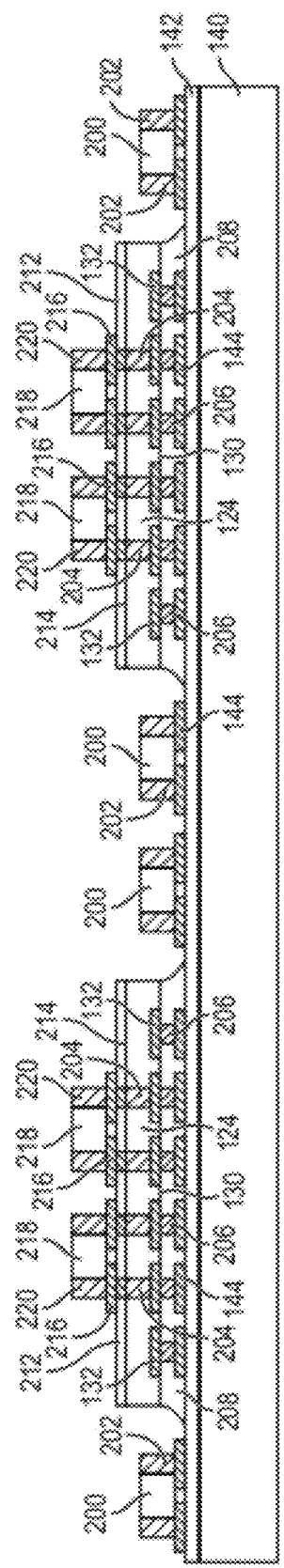

In FIG. 9e, an insulating or passivation layer 212 is formed over back surface 214 of semiconductor die 124 following the thinning operation. The insulating layer 212 is formed using PVD, CVD, printing, spin coating, spray coating, sintering or thermal oxidation. The insulating layer 212 contains one or more layers of SiO2, Si3N4, SiON, Ta2O5, Al2O3, or other material having similar insulating and structural properties. A portion of insulating layer 212 is removed by an etching process to expose conductive TSV 204.

An electrically conductive layer 216 is formed over insulating layer 212 and the exposed conductive TSV 204 using a patterning and metal deposition process such as sputtering, electrolytic plating, and electroless plating. Conductive layer 216 can be one or more layers of Al, Cu, Sn, Ni, Au, Ag, or other suitable electrically conductive material. Conductive layer 216 operates as wettable contact pads containing flux material. One portion of conductive layer 216 is electrically connected to conductive TSV 204. Other portions of conductive layer 216 can be electrically common or electrically isolated depending on the design and function of semiconductor die 124.

A plurality of discrete semiconductor components 218 is mounted to conductive layer 216 using a pick and place operation. A solder paste can be deposited on leads 220 of discrete semiconductor components 218. A reflow operation is used to metallurgically and electrically connect discrete semiconductor components 218 to conductive layer 216. Examples of discrete semiconductor components 218 include individual transistors, diodes, resistors, capacitors, and inductors, as well as other active and passive discrete components.

Figure 9F:
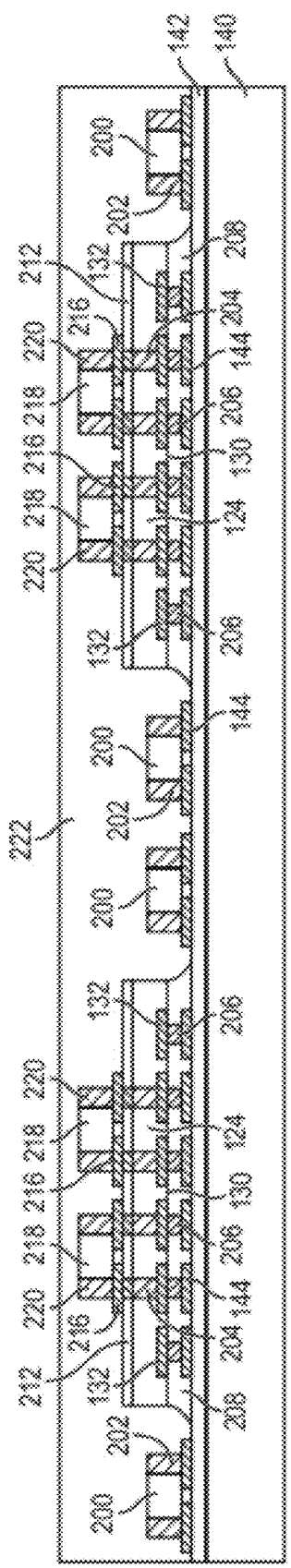

In FIG. 9f, an encapsulant or molding compound 222 is deposited over carrier 140, semiconductor die 124, and discrete semiconductor components 200 and 218 using a paste printing, compressive molding, transfer molding, liquid encapsulant molding, vacuum lamination, spin coating, or other suitable applicator. Encapsulant 222 can be polymer composite material, such as epoxy resin with filler, epoxy acrylate with filler, or polymer with proper filler. Encapsulant 222 is non-conductive and environmentally protects the semiconductor device from external elements and contaminants. Wettable contact pads 144 and 216 hold semiconductor die 124 and discrete semiconductor components 200 and 218 securely in place to reduce die and component shifting during encapsulation and subsequent die thinning operations.

Figure 9G:
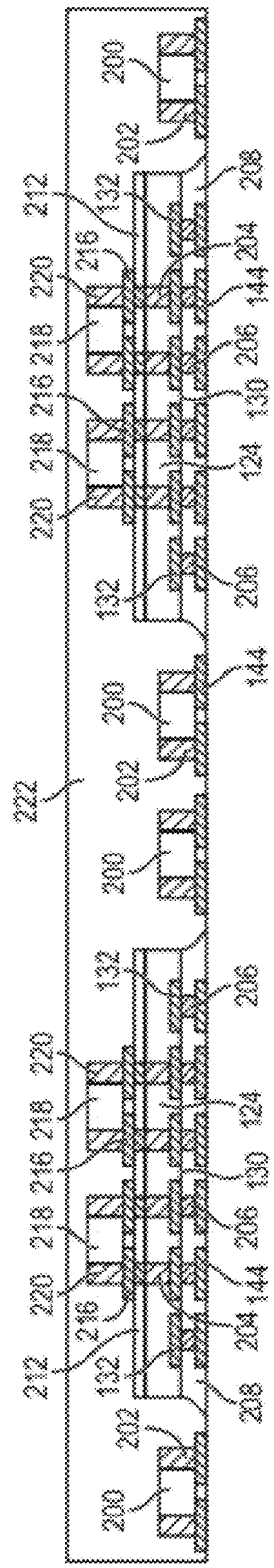

In FIG. 9g, carrier 140 and interface layer 142 are removed by chemical etching, mechanical peeling, CMP, mechanical grinding, thermal bake, UV light, laser scanning, or wet stripping to expose semiconductor die 124 and encapsulant 222.

Figure 9H:
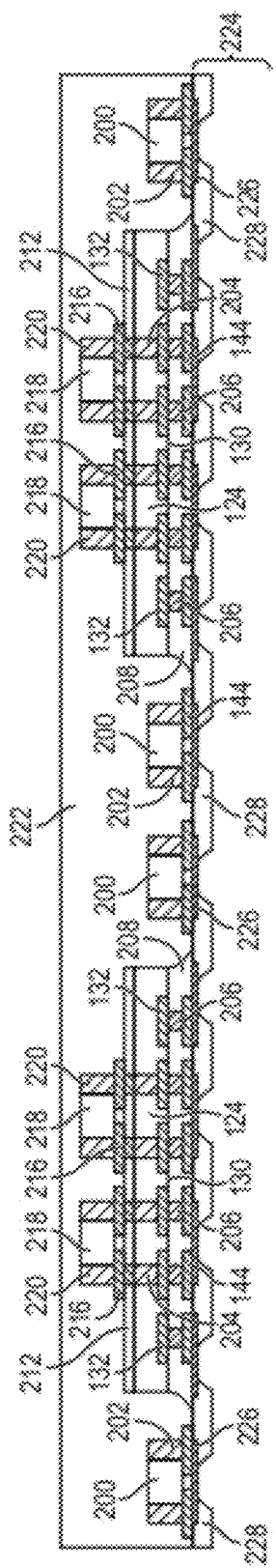

In FIG. 9h, a build-up interconnect structure 224 is formed over semiconductor die 124 and encapsulant 222. The build-up interconnect structure 224 includes an electrically conductive layer or RDL 226 formed using a patterning and metal deposition process such as sputtering, electrolytic plating, and electroless plating. Conductive layer 226 can be one or more layers of Al, Cu, Sn, Ni, Au, Ag, or other suitable electrically conductive material. One portion of conductive layer 226 is electrically connected to conductive layer 144. Other portions of conductive layer 226 can be electrically common or electrically isolated depending on the design and function of semiconductor die 124.

An insulating or passivation layer 228 is formed around conductive layer 226 for electrical isolation using PVD, CVD, printing, spin coating, spray coating, sintering or thermal oxidation. The insulating layer 228 contains one or more layers of SiO2, Si3N4, SiON, Ta2O5, Al2O3, or other material having similar insulating and structural properties. A portion of insulating layer 228 can be removed by an etching process to expose conductive layer 226 for additional electrical interconnect.

Figure 9I:
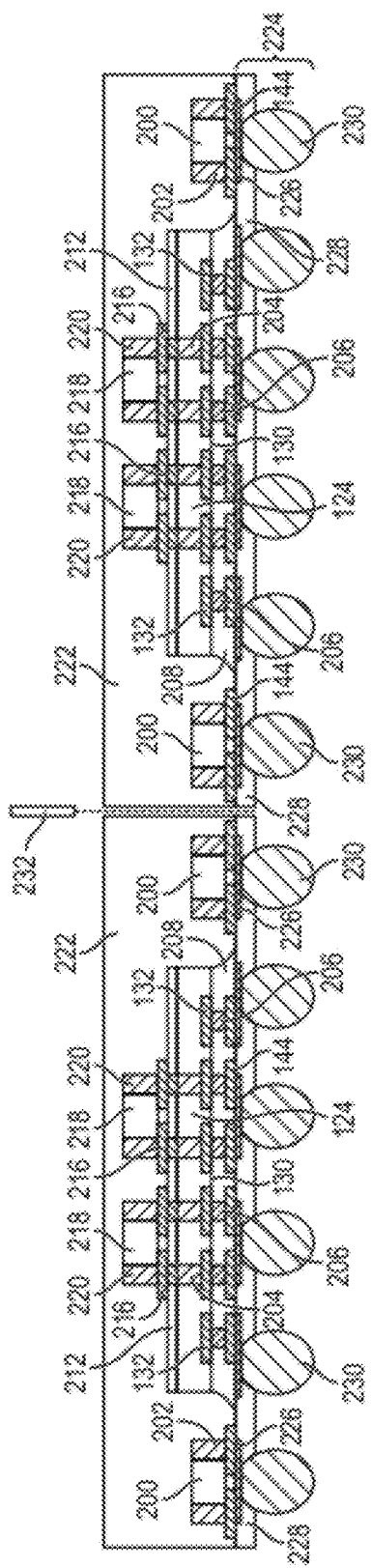

In FIG. 9i, an electrically conductive bump material is deposited over build-up interconnect structure 224 and electrically connected to the exposed portion of conductive layer 226 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 226 using a suitable attachment or bonding process. In one embodiment, the bump material is reflowed by heating the material above its melting point to form spherical balls or bumps 230. In some applications, bumps 230 are reflowed a second time to improve electrical contact to conductive layer 226. A UBM can be formed under bumps 230. The bumps can also be compression bonded to conductive layer 226. Bumps 230 represent one type of interconnect structure that can be formed over conductive layer 226. The interconnect structure can also use stud bump, micro bump, or other electrical interconnect.

Figure 10:
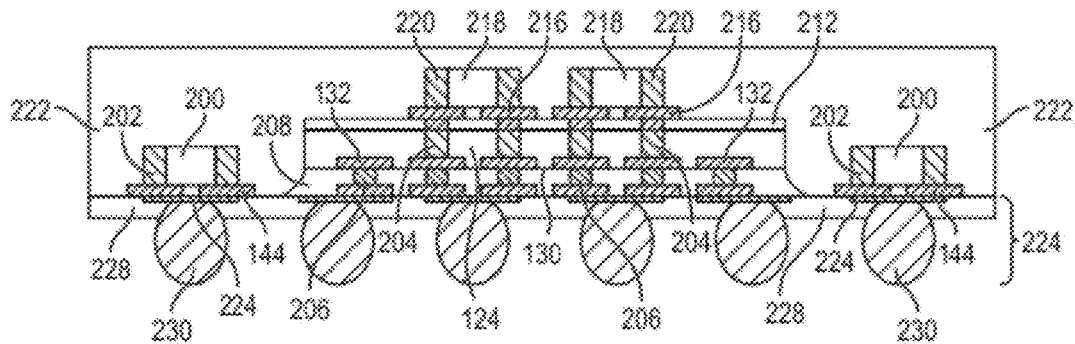
FIG. 10 illustrates the Fo-WLCSP with discrete semiconductor components mounted over the semiconductor die.

Semiconductor die 124 are singulated through encapsulant 222 and build-up interconnect structure 224 with saw blade or laser cutting tool 232 into individual Fo-WLCSP 234. FIG. 10 shows Fo-WLCSP 234 after singulation. Semiconductor die 124 is electrically connected through contact pads 132 to conductive layer 144 and build-up interconnect structure 224. Discrete semiconductor components 200 are electrically connected to conductive layer 144 and build-up interconnect structure 224. Discrete semiconductor components 218 are electrically connected to contact pads 132 of semiconductor die 124, conductive layer 144, conductive TSV 204, and build-up interconnect structure 224.

Figure 11:
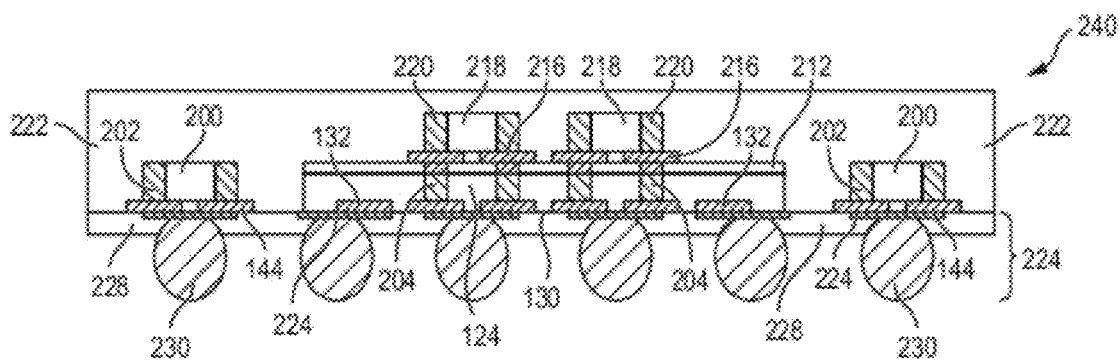
FIG. 11 illustrates the Fo-WLCSP with the semiconductor die mounted directly to the build-up interconnect structure.

FIG. 11 shows an embodiment of Fo-WLCSP 240, similar to FIG. 10, without bumps 206. Contact pads 132 of semiconductor die 124 are electrically connected to conductive layer 226 of build-up interconnect structure 224. Alternatively, contact pads 132 of semiconductor die 124 are electrically connected wettable contact pads 144. Semiconductor die 124 can be secured to build-up interconnect structure 224 using adhesive layer to reduce die and component shifting during encapsulation and thinning operations.

Figure 12:
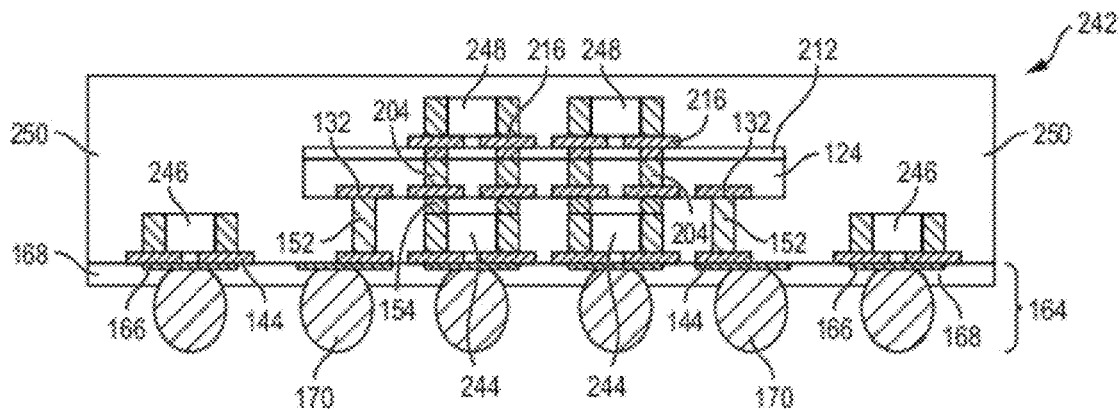
FIG. 12 illustrates the Fo-WLCSP with discrete semiconductor components mounted under and over the semiconductor die.

FIG. 12 shows an embodiment of Fo-WLCSP 242 with discrete semiconductor components 244 mounted under semiconductor die 124 and discrete semiconductor components 246 mounted around semiconductor die 124, similar to FIGS. 4a-4l, and discrete semiconductor components 248 mounted over the semiconductor die, similar to FIGS. 9a-9i. Encapsulant 250 is deposited over discrete semiconductor components 244, 246, and 248 and semiconductor die 124.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   forming a plurality of wettable contact pads over the carrier;
   mounting a plurality of first discrete semiconductor components over the wettable contact pads;
   mounting a plurality of second discrete semiconductor components over the wettable contact pads;

forming a plurality of conductive pillars over the wettable contact pads;

mounting a semiconductor die to the conductive pillars over the first discrete semiconductor components with the second discrete semiconductor components disposed outside a footprint of the semiconductor die;

depositing an encapsulant over the semiconductor die and first and second discrete semiconductor components;

removing a portion of a back surface of the semiconductor die opposite the conductive pillars;

removing the carrier; and forming a first interconnect structure over the encapsulant and semiconductor die.

2. The method of claim 1, wherein the wettable contact pads reduce shifting of the semiconductor die and first and second discrete semiconductor components during encapsulation.

3. The method of claim 1, further including mounting a plurality of third discrete semiconductor components over the semiconductor die prior to depositing the encapsulant.

4. The method of claim 1, further including depositing an insulating material over the first discrete semiconductor components prior to mounting the semiconductor die.

5. The method of claim 1, further including forming a second interconnect structure over the first discrete semiconductor components for electrical connection to the semiconductor die.

6. The method of claim 1, further including forming a plurality of conductive vias through the semiconductor die.

7. A method of making a semiconductor device, comprising:

providing a carrier;

mounting a first discrete semiconductor component over the carrier;

forming a first interconnect structure over the carrier;

mounting a semiconductor die to the first interconnect structure over the first discrete semiconductor component;

depositing an encapsulant over the semiconductor die and first discrete semiconductor component;

removing a portion of a back surface of the semiconductor die opposite the first interconnect structure;

removing the carrier; and forming a second interconnect structure over the encapsulant and semiconductor die.

8. The method of claim 7, further including mounting a second discrete semiconductor component over the carrier outside a footprint of the semiconductor die.

9. The method of claim 7, further including forming a plurality of wettable contact pads over the carrier prior to mounting the first discrete semiconductor component and forming the first interconnect structure.

10. The method of claim 7, wherein the first interconnect structure includes conductive pillars or stacked bumps.

11. The method of claim 7, wherein the first interconnect structure includes bumps.

12. The method of claim 7, further including forming a shielding layer between the first discrete semiconductor component and semiconductor die.

13. The method of claim 7, further including mounting a third discrete semiconductor component over the semiconductor die.

14. A method of making a semiconductor device, comprising:

providing a carrier;

mounting a first discrete semiconductor component over the carrier;

mounting a semiconductor die to the carrier with the first discrete semiconductor component disposed outside a footprint of the semiconductor die;

removing a portion of a back surface of the semiconductor die;

mounting a second discrete semiconductor component over the semiconductor die;

depositing an encapsulant over the semiconductor die and first and second discrete semiconductor components;

removing the carrier; and forming an interconnect structure over the encapsulant and semiconductor die.

15. The method of claim 14, further including forming a plurality of wettable contact pads over the carrier prior to mounting the first discrete semiconductor component and semiconductor die.

16. The method of claim 14, further including forming an insulating layer over the semiconductor die.

17. The method of claim 14, further including forming a plurality of wettable contact pads over the semiconductor die.

18. The method of claim 14, further including forming a plurality of conductive vias through the semiconductor die, the conductive vias being electrically connected to the second discrete semiconductor component.

19. The method of claim 14, further including depositing an underfill material under the semiconductor die.

20. The method of claim 14, further including mounting a third discrete semiconductor component under the semiconductor die.

21. A method of making a semiconductor device, comprising:

providing a carrier including a designated area;

mounting a first discrete semiconductor component over the carrier and within a footprint of the designated area of the carrier;

mounting a semiconductor die over the carrier and within the footprint of the designated area of the carrier;

removing a portion of a back surface of the semiconductor die;

depositing an encapsulant over the semiconductor die and first discrete semiconductor components;

removing the carrier; and forming an interconnect structure over the encapsulant and semiconductor die.

22. The method of claim 21, further including mounting a second discrete semiconductor component over the carrier and outside the footprint of the designated area of the carrier.

23. The method of claim 21, further including forming a plurality of wettable contact pads over the carrier.

24. The method of claim 21, further including forming a conductive pillar or bump over the carrier and within the footprint of the designated area of the carrier.

25. The method of claim 21, further including:

the semiconductor die comprising a conductive via formed through the semiconductor die;

forming a conductive layer over and electrically connected to the conductive via of the semiconductor die; and mounting the first discrete semiconductor component to the conductive layer.

* * * * *